United States Patent [19]
Stahlhofen et al.

[11] Patent Number: 4,576,901
[45] Date of Patent: Mar. 18, 1986

[54] PROCESS FOR PRODUCING NEGATIVE COPIES BY MEANS OF A MATERIAL BASED ON 1,2-QUINONE DIAZIDES WITH 4-ESTER OR AMIDE SUBSTITUTION

[75] Inventors: Paul Stahlhofen; Gerhard Mack, both of Wiesbaden, Fed. Rep. of Germany

[73] Assignee: Hoechst Aktiengesellschaft, Frankfurt am Main, Fed. Rep. of Germany

[21] Appl. No.: 626,759

[22] Filed: Jul. 2, 1984

[30] Foreign Application Priority Data

Jul. 11, 1983 [DE] Fed. Rep. of Germany ....... 3325023

[51] Int. Cl.$^4$ .......................... G03F 7/26; G03F 7/08
[52] U.S. Cl. .................................... 430/325; 430/192; 430/193; 430/328; 430/330; 430/302; 430/309; 430/326
[58] Field of Search ............... 430/325, 328, 330, 192, 430/193, 302, 309

[56] References Cited

U.S. PATENT DOCUMENTS

| | | | |
|---|---|---|---|
| 3,264,104 | 8/1966 | Reichel | 96/33 |
| 4,104,070 | 8/1978 | Moritz et al. | 96/36 |
| 4,196,003 | 4/1980 | Watanabe | 430/193 |
| 4,356,254 | 10/1982 | Takahashi et al. | 430/330 |
| 4,356,255 | 10/1982 | Tachikawa et al. | 430/330 |
| 4,431,725 | 2/1984 | Tachikawa et al. | 430/328 |
| 4,439,516 | 3/1984 | Cernigliavo et al. | 430/330 |

FOREIGN PATENT DOCUMENTS

| | | |
|---|---|---|
| 0021719 | 7/1981 | European Pat. Off. . |
| 0024916 | 11/1981 | European Pat. Off. . |
| 1494640 | 12/1977 | United Kingdom . |
| 2082339 | 3/1982 | United Kingdom . |

OTHER PUBLICATIONS

Kosar, "Light Sensitive Systems", 1965; Section 7.4, pp. 339-351.

Primary Examiner—Charles L. Bowers, Jr.
Attorney, Agent, or Firm—Schwartz, Jeffery, Schwaab, Mack, Blumenthal & Evans

[57] ABSTRACT

A process for producing negative relief copies is disclosed in which a light-sensitive material, consisting essentially of (1) a binder which is insoluble in water and soluble in aqueous-alkaline solutions and (2) a light-sensitive ester or amide of a 1,2-benzoquinone-2-diazide-4-sulfonic acid, a 1,2-benzoquinone-2-diazide-4-carboxylic acid, a 1,2-naphthoquinone-2-diazide-4-sulfonic acid, or a 1,2-naphthoquinone-2-diazide-4-carboxylic acid, is imagewise exposed, thereafter heated and, after cooling, exposed again without an original, and subsequently developed by means of an aqueous-alkaline developer. The disclosed process permits the production of negative copies with the aid of a material which yields positive copies when it is processed in a conventional manner.

11 Claims, No Drawings

PROCESS FOR PRODUCING NEGATIVE COPIES BY MEANS OF A MATERIAL BASED ON 1,2-QUINONE DIAZIDES WITH 4-ESTER OR AMIDE SUBSTITUTION

BACKGROUND OF THE INVENTION

The present invention relates to a reversal process for producing negative copies by means of a normally positive-working light-sensitive material based on 1,2-quinone diazides.

It is known that positive-working reproduction materials based on 1,2-naphthoquinone diazides can be negatively processed by a particular sequence of treatment steps. In U.S. Pat. No. 3,264,104, a reversal process of this kind is described in which the light-sensitive layer, which preferably contains thermoplastic polymers, is imagewise exposed, is treated with an alkaline solution or with water (if appropriate, at an elevated temperature) without washing off the exposed areas in the process, is then exposed again without an original, and finally is developed in a conventional manner, such that the originally imagewise exposed areas remain on the support and the other areas are washed off.

This process has the disadvantages that a comparatively large number of treatment steps are required; that the first treatment with alkali must invariably be carried out with particular care, in order to detach as little as possible of the exposed layer, which is soluble in aqueous alkali; and that it is necesary to add polymers which are sparingly soluble in alkali and which limit the applicability of the material to other uses.

European Patent Application No. 0,024,916 discloses a similar reversal process for the production of resist layers, in which a photosensitive material based on 1,2-quinone diazides is heated after imagewise exposure, then exposed again without an original and developed with an aqueous alkaline solution to form a negative. The light-sensitive layer of the disclosed material contains particular photochromic compounds which react with the products of the photoreaction undergone by the quinone diazide with heating of the material, and are stated to effect curing of the layer. In this material, photochromic substances must be present, the photoreaction of which produces a discoloration which is inconvenient in some applications.

British Patent Application No. 2,082,339 describes a light-sensitive composition comprising an o-quinone diazide and at least one resol, for use in the manufacture of a lithographic printing plate which is suitable for both positive and negative processing. This reversal process covers the same sequence of steps as the process disclosed by the aforementioned European patent application. The reversal action is based on the fact that the photodecomposition products of the o-quinone diazide form an insoluble reaction product with the resol, under the action of heat. A reaction of this kind does not occur if novolaks are used. The printing plates so produced have the disadvantage of a relatively poor shelf-life, due to the self-curing character of resols.

In German Offenlegungsschriften Nos. 2,855,723 and 2,529,954 resist layers comprising 1,2-quinone diazides are described, which layers are used for a reversal process and contain, in addition, N-acyl-N'-methylolethylenediamines or hydroxyethylimidazoles to effect thermal curing of the layer. A similar material comprising secondary or tertiary amines is described in U.S. Pat. No. 4,196,003.

Additives of the kind mentioned above, however, generally have an adverse influence on the shelf-life of the copying layers and on specific properties relating to copying technique, such as, for example, sensitivity to light and image contrast after exposure.

SUMMARY OF THE INVENTION

It is, therefore, an object of the present invention to provide a reversal process for producing negative copies by means of a normally positive-working light-sensitive material based on 1,2-quinone diazides, which process does not have the above-indicated disadvantages and which does not require the use of additives in the copying layer in order to make possible thermal curing of the exposed layer areas.

In accomplishing the foregoing object, there has been provided, in accordance with one aspect of the present invention, a process for producing negative relief copies, comprising the steps of imagewise exposing a light-sensitive material through an original, said material comprising a light-sensitive layer which comprises a binder that is insoluble in water and soluble in aqueous-alkaline solutions and a 1,2-quinone diazide comprising at least one of an ester and an amide of one selected from the group consisting of 1,2-benzoquinone-2-diazide-4-sulfonic acid, a 1,2-benzoquinone-2-diazide-4-carboxylic acid, a 1,2-naphthoquinone-2-diazide-4-sulfonic acid, and a 1,2-naphthoquinone-2-diazide-4-carboxylic acid, thereafter heating the material; then, after cooling, exposing the material again without the original; and thereafter developing the material with an aqueous-alkaline developer.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF PREFERRED EMBODIMENTS

The process of the present invention is characterized in that the material comprises, as a light-sensitive compound, as ester or an amide of a 1,2-benzoquinone-2-diazide-4-sulfonic acid, of a 1,2-benzoquinone-2-diazide-4-carboxylic acid, of a 1,2-naphthoquinone-2-diazide-4-sulfonic acid, or of a 1,2-naphthoquinone-2-diazide-4-carboxylic acid.

Unexpectedly, it has been found that the naphthoquinone-(1,2)-diazide-(2)-4 derivatives are much more suitable for use as sensitizers in the reversal process described in greater detail below than are the corresponding naphthoquinone-(1,2)-diazide-(2)-5 derivatives. More specifically, it has been found, according to the invention, that the exposed layer areas of the light-sensitive material are cured at an elevated temperature, even without additives, and are thus rendered insoluble in the developer, when o-quinonediazide-4-sulfonic acid esters are used as sensitizers in the copying layer, rather than, for example, o-quinonediazide-5 derivatives. This thermal curing can only be achieved if the copying layers are admixed with special additives which effect a solidification of the irradiated layer areas.

A copying layer, for example, which comprises a naphthoquinone-(1,2)-diazide-(2)-4-sulfonic acid ester and a cresol-formaldehyde novolak as a binder, and which is heated to 140° C. after irradiation with ultraviolet radiation, is already cured after 1 minute and is insoluble in the developer. In contrast, an irradiated copying layer, in which the corresponding naphthoquinone-(1,2)-diazide-(2)-5-sulfonic acid ester is used under conditions which are otherwise identical, is not cured at 140° C. and, thus, remains soluble in the developer. Only after the latter irradiated copying layer is heated for 3 minutes does a slight curing of the layer occur, but this slight curing does not produce any resistance to the developer. If the heating time at 140° C. is extended, for example, to 4 or 5 minutes, the unexposed constituents of the layer begin to decompose and are rendered sparingly soluble or insoluble in the developer. Consequently, it is impossible thereafter to obtain a differentiation between a positive an a negative copy.

It is only possible to effect reversal development with material based on a naphthoquinone-(1,2)-diazide-(2)-5-sulfonic acid ester by including therewith specific additives, such as a resol, a secondary or tertiary amine, or some other compound. In contrast, the process of the present invention has the advantage that o-quinonediazide-4-sulfonic acid derivatives or o-quinonediazide-4-carboxylic acid derivatives used as sensitizers in the copying layer do not require such additives. Consequently, particular drawbacks in copying technique which are occasioned by these additives do not arise.

Sensitizers which are suitable for use according to the present invention comprise any 1,2-quinonediazide-4-sulfonic acid ester, 1,2-quinonediazide-4-sulfonic acid ester, 1,2-quinonediazide-4-sulfonic acid amide, 1,2-quinonediazide-4-carboxylic acid ester, or 1,2-quinonediazide-4-carboxylic acid amide that is rendered soluble in aqueous-alkaline solutions after irradiation with actinic light. Included are the reaction products of 1,2-benzoquinonediazide-4-sulfonic acid or 1,2-benzoquinonediazide-4-sulfonic acid chloride, or of 1,2-naphthoquinonediazide-4-sulfonic acid or 1,2-naphthoquinonediazide-4-sulfonic acid chloride, with phenol-aldehyde/acetone condensation products or with polymers of p-hydroxystyrene, p-aminostyrene, or copolymers of these last two compounds.

Esters which may be used include the known reaction products of the acids, or of the halides thereof, with phenols, in particular with polyhydric phenols, such as 2,3,4-trihydroxybenzophenone, 2,4-dihydroxy-benzophenone, 4-decanoyl-resorcinol, 4-(2-phenyl-prop-2-yl) phenol, gallic acid octylester, and 4,4-bis-(4-hydroxyphenyl)-valeric acid butylester. The amides may be derived in a known manner from aromatic or longer-chain aliphatic amines.

The amount of o-quinonediazide compounds generally ranges from 3 to 50% by weight, preferably from 7 to 35% by weight, based on the weight of the nonvolatile constituents of the copying layer.

In addition to the above-indicated 4-substituted o-quinonediazides, this total amount may also include relatively small quantities of conventional 1,2-naphthoquinone-diazide-5-sulfonic acid derivatives, preferably 1,2-naphthoquinonediazide-5-sulfonic acid esters. Generally, the quantity of 5-sulfonic acid derivatives should not exceed 50%, and preferably should not exceed about 20%, of the amount of 4-substituted quinone diazides.

The light-sensitive compositions further contain a polymeric, water-insoluble resinous binder which is soluble in the solvents used for the composition according to the present invention and is also soluble, or at least swellable, in aqueous alkaline solutions.

The novolak condensation resins, widely used in many positive copying materials based on naphthoquinone diazides, have also proved useful as binders in the process according to the present invention. These novolaks can also be modified, in a known manner, by reacting part of their hydroxy groups, for example, with chloroacetic acid, isocyanates, epoxides or carboxylic acid anhydrides. Additional preferred binders which are soluble or swellable in alkali include polyhydroxyphenyl resins which are prepared by condensing phenols with aldehydes or ketones; copolymers of styrene and maleic anhydride; polyvinylphenols; and copolymers of acrylic acid or methacrylic acid, in particular with acrylic or methacrylic acid esters.

The type and quantity of the alkali-soluble resin may vary depending on the intended purpose; preferably, the proportion of alkali-soluble resins in the total solids is between 90 and 30% by weight, particularly preferably between 85 and 55% by weight. Moreover, numerous other resins can also be used; preferably these include epoxy resins and vinyl polymers, such as polyvinyl acetates, polyacrylates, polyvinyl acetals, polyvinyl ethers, polyvinylpyrrolidones and copolymers of the monomers on which these are based, as well as hydrogenated or partially hydrogenated colophony derivatives.

The most advantageous proportion of these resins depends on technical requirements and the effect on the development conditions, and is, in general, not more than 50% by weight, preferably from about 2 to 35% by weight, of the alkali-soluble resin. To meet special requirements, such as flexibility, adhesion, gloss and coloration, the light-sensitive composition can additionally contain substances such as polyglycols; cellulose derivatives, such as ethylcellulose; surfactants, dyes, adhesion-promoters and finely-divided pigments; and also ultraviolet absorbers, if required.

For color change after exposure, the light-sensitive composition can also be admixed with small amounts of radiation-sensitive components which preferably form or split-off strong acids upon exposure and produce a color change in a subsequent reaction with a suitable dye. Radiation-sensitive components of that kind include, for example, 1,2-naphthoquinone-diazide-4-sulfonic acid chloride, halogenomethyl-s-triazines which have chromophoric substituents, and diazonium compounds in the form of their salts with complex acids, such as tetrafluoroboric acid or hexafluorophosphoric acid.

For coating a suitable support, the compositions are in general dissolved in a solvent. The selection of the solvents should be matched to the coating process to be used, the desired layer thickness and the drying conditions. Suitable solvents for the composition according to the present invention are ketones, such as methyl ethyl ketone; chlorinated hydrocarbons, such as trichloroethylene and 1,1,1-trichloroethane; alcohols, such as n-propanol; ethers such as tetrahydrofuran; alcohol-ethers, such as ethylene glycol monoethyl ether; and esters, such as butyl acetate. It is also possible to use mixtures which, for special purposes, can also contain solvents, such as acetonitrile, dioxane or dimethylformamide. In principle, all those solvents which do not irreversibly react with the layer components can be used. Particularly preferred solvents comprise the partial ethers of glycols, especially ethylene glycol monomethyl ether.

In most cases, the supports used for layer thickness of less than about 10 μm are metals. The following may be used for offset printing plates: mill-finished, mechanically or electrochemically roughened aluminum which, if desired, has been anodically oxidized and which additionally can also have been chemically pretreated, for example, with polyvinylphosphonic acid, silicates, phosphates, hexafluorozironates, or with hydrolyzed tetraethyl orthosilicate.

Coating of the support material is carried out in a known manner by spin-coating, by spraying, by dipping, by roller-coating, by means of slot dies, by blade-spreading or by means of a coater application. Light sources customary in industry are used for exposure. Irradiation with electrons or with a laser is another possiblity for producing an image.

The aqueous-alkaline solutions which are used for developing have a graduated alkalinity, that is to say, they have a pH which is preferably in the range between 10 and 14, and they can also contain minor amounts of organic solvents or surfactants.

After imagewise irradiation or exposure, the material is heated without any further intermediate treatment. Heating can be effected by irradiation, convection, contact with heated surfaces, for example, with rollers, or by immersion in a heated bath comprising an inert liquid, for example, water. The temperature can range between 80° and 160° C., preferably between 110° and 140° C. These temperatures are tolerated by the compositions of the present invention without any considerable change in the properties of the unexposed areas. The duration of heating can vary widely, depending on the method chosen for the application of heat. If a heat-transferring medium is used, the heating time generally ranges between 30 seconds and 30 minutes, preferably between 1 minute and 4 minutes.

Following heating and cooling, the light-sensitive layer is subjected to an overall exposure, whereby the layer areas which are still sensitive to light are completely converted into their photodecomposition products. For the second exposure, the light source employed in the imagewise exposure can advantageously be used again.

The second exposure is followed by developing with conventional developers, whereby the layer areas which were not struck by light in the original imagewise exposure are washed off. Suitable developers preferably comprise aqueous solutions of alkaline substances, for example, of alkali-metal phosphates, silicates, carbonates or hydroxides, which can additionally contain surfactants or relatively small amounts of organic solvents. In particular cases, suitable developers also comprise organic solvents or mixtures of organic solvents with water. The material can be developed either immediately after heating and cooling, or after a time interval of, for example, several hours, without any attack occurring in the hardened layer areas. This indicates that the exposed layer areas are irreversibly cured by heating.

The process according to the invention has the advantage that it is not necessary to use special additives which can cause solidifiction of the exposed layer areas at an elevated temperature and moreover, that neither additional treatment steps in which liquids are used nor a particular composition of the light-sensitive material are required. For the only additional treatment step, i.e., heating, existing drying apparatus can easily be used in most cases. The second exposure without an original is most simply performed with the aid of the light source used for imagewise exposing the material.

The process also makes it possible to control resolution by varying the exposure times.

The process of the present invention can, for example, be applied in the production of printing forms for letterpress printing, gravure printing and planographic printing; in the production of photoresist stencils for the subtractive and additive preparation of printed circuit boards; in the production of nickel screen-printing cylinders prepared by an electroplating process; and in the production of masks in microelectronics, according to the lift-off technique.

In the examples which follow, preferred embodiments of the process according to the present invention are described. Percentages and quantitative ratios are to be understood as units of weight, unles otherwise indicated.

EXAMPLE 1

An electrolytically roughened and anodically oxidized aluminum sheet was coated with a solution comprising 3.00 parts by weight of the esterifiction product obtained from 1 mole of 4-(2-phenyl-prop-2-yl)-phenol and 1 mole of naphthoquinone-(1,2)-diazide-(2)-4-sulfonic acid chloride, 0.10 parts by weight of naphthoquinone-(1,2)-diazide-(2)-4-sulfonic acid chloride, 6.00 parts by weight of a cresol-formaldehyde novolak having a softening range from 105° to 120° C., as measured according to the capillary method DIN 53,181, and 0.07 part by weight of crystal violet, in 50.00 parts by weight of ethylene glycol monomethyl ether and 50.00 parts by weight of tetrahydrofuran.

The anodically oxidized aluminum support had been treated with an aqueous solution of polyvinylphosphonic acid, as described in German Pat. No. 1,621,478, before it was coated with the light-sensitive copying layer.

The presensitized material prepared in this manner, in which the light-sensitive layer had a weight of about 2.0 g/m$^2$, was imagewise exposed under a transport positive original and thereafter developed with a 2% strength aqueous solution of sodium metasilicate.9H$_2$O. In the developing procedure, those portions of the copying layer which had been struck by light were removed and the unexposed image areas remained on the support, such that a printing stencil corresponding to the original was obtained. The printing stencil was inked with a greasy ink to produce a positive printing form which was ready for printing.

Another sample of the same presensitized material was processed to give a negative printing plate. For this purpose, the sample was exposed under a negative original, then heated for 1 minute at 140° C. and exposed again without an original for the same period of time as used in the imagewise exposure. Upon developing in the same developer and for the same period of time as used above, a reversed image of the original was obtained.

If the sensitizer indicated in Example 1 was replaced by the corresponding ester of naphthoquinone-(1,2)-diazide-(2)-5-sulfonic acid and the above-described reversal process repeated under identical test conditions, reversal developing of the positive-working light-sensitive material proved to be impossible. In the presence of the above-specified naphthoquinone-(1,2)-diazide-(2)-4-sulfonic acid ester, the exposed layer areas became insoluble in the developer after heating for 1 minute at 140° C., whereas the exposed layer areas comprising the naphthoquinone-(1,2)-diazide-(2)-5-sulfonic acid ester were still soluble in the developer, even after heating for 3 minutes at 140° C. Consequently, differentiation between a positive and a negative copy was impossible. If the heating time and/or the temperature were further increased in the latter case, the unexposed layer areas began to decompose so that differentiation was impossible.

EXAMPLE 2

An electrochemically roughened and anodically oxidized alumium sheet which had been treated with an aqueous solution of 0.1% by weight of polyvinylphosphonic acid, was coated with a solution comprising
4.00 parts by weight of the naphthoquinone-diazide sulfonic acid ester used in Example 1,
5.00 parts by weight of a poly-p-vinylphenol having a mean molecular weight of 10,000,
0.10 part by weight of naphthoquinone-(1,2)-diazide-(2)-4-sulfonic acid chloride, and
0.07 part by weight of crystal violet, in
50.00 parts by weight of ethylene glycol monomethyl ether and
50.00 parts by weight of tetrahydrofuran.

The presensitized material prepared in this manner was imagewise exposed under a transparent positive original and then was developed with a 0.5% strength solution of sodium metasilicate to produce a positive printing stencil corresponding to the original.

Another sample of the same material was processed to give a negative printing plate. For this purpose, the sample was exposed under a negative original, then was heated for 1 minute at 140° C. and exposed again without an original for the same period of time as used in the imagewise exposure. Upon developing in the same developer and for the same period of time as used above, a reversed image of the original was obtained.

EXAMPLE 3

An aluminum sheet which had been treated as indicated in Example 1 was coated with a solution comprising
2.00 parts by weight of the esterification product obtained from 1 mole of 4-(2-ethylhexanoyl)-resorcinol and 2 moles of naphthoquinone-(1,2)-diazide-(2)-4-sulfonic acid chloride,
5.00 parts by weight of the cresol-formaldehyde novolak specified in Example 1,
0.10 part by weight of 2-(4-ethoxy-paphth-1-yl)-4,6-bis-trichloromethyl-s-triazine, and
0.07 part by weight of crystal violet, in
50.00 parts by weight of ethylene glycol monomethyl ether and
50.00 parts by weight of tetrahydrofuran.

The presensitized material prepared in this manner was imagewise exposed under a transparent positive original and then developed with a 1% strength solution of sodium metasilicate to produce a positive printing stencil corresponding to the original.

Another sample of the same material was processed to give a negative printing plate. For this purpose, the sample was exposed under a negative original, then was heated for 1 minute at 140° C. and exposed again without an original for the same period of time as used in the imagewise exposure. Upon developing in the same developer and for the same period of time as used above, a reversed image of the original was obtained.

EXAMPLE 4

An electrochemically roughened and anodically oxidized aluminum sheet was coated with a solution comprising:
3.00 parts by weight of the naphthoquinonediazide-sulfonic acid ester used in Example 1,
6.00 parts by weight of the condensation product obtained from 2-methyl-resorcinol and acetone, having a mean molecular weight of 2,000,
0.20 part by weight of naphthoquinone-(1,2)-diazide-(2)-4-sulfonic acid chloride, and
0.08 part by weight of crystal violet, in
50.00 parts by weight of ethylene glycol monomethyl ether and
50.00 parts by weight of tetrahydrofuran.

The presensitized material prepared in this manner was imagewise exposed under a transparent positive original and then developed with a 6% strength solution of sodium metasilicate to produce a positive printing stencil corresponding to the original.

Another sample of the same material was processed to give a negative printing plate. For this purpose, the sample was exposed under a negative original, then was heated for 3 minutes at 140° C. and exposed again without an original for the same period of time as used in the imagewise exposure. Upon developing in the same developer and for the same period of time as used above, a reversed image of the original was obtained.

EXAMPLE 5

An aluminum sheet which had been treated as indicated in Example 1 was coated with a solution comprising
1.00 part by weight of the esterification product obtained from 1 mole of 4-hexadecanoylresorcinol and 2 moles of naphthoquinone-(1,2)-diazide-(2)-4-sulfonic acid chloride,
5.00 parts by weight of the cresol-formaldehyde novolak specified in Example 1,
0.10 part by weight of 2-(4-ethoxy-naphth-1-yl)-4,6-bis-trichloromethyl-s-triazine, and
0.07 part by weight of crystal violet, in
50.00 parts by weight of ethylene glycol monomethyl ether and
50.00 parts by weight of tetrahydrofuran.

The presensitized material prepared in this manner was imagewise exposed under a transparent positive original and then developed with a 3% strength solution of sodium metasilicate to produce a positive printing stencil corresponding to the original.

Another sample of the same material was processed to give a negative printing plate. For this purpose, the sample was exposed under a negative original, then was heated for 90 seconds at 140° C. and exposed again without an original for the same period of time as used in the imagewise exposure. Upon developing in the same developer and for the same period of time as used above, a reversed image of the original was obtained.

EXAMPLE 6

An electrolytically roughened and anodically oxidized aluminum sheet was coated with a solution comprising 1.00 part by weight of the esterification product obtained from 1 mole of 2,3,4-trihydroxybenzophenone and 3 moles of naphthoquionone-(1,2)-diazide-(2)-4-sulfonic acid chloride, 0.10 part by weight of naphthoquinone-(1,2)-diazide-(2)-4-sulfonic acid chloride, 6.00 parts by weight of the novolak used in Example 1, and 0.07 part by weight of crystal violet, in 50.00 parts by weight of ethylene glycol monomethyl ether and 50.00 parts by weight of tetrahydrofuran The anodically oxidized aluminum support had been treated with an aqueous solution of polyvinylphosphonic acid, as described in German Pat. No. 1,621,478, before the light sensitive copying layer was applied.

The presensitized material prepared in this manner was imagewise exposed under a transparent positive original and then developed with a 2% strength solution of sodium metasilicate to produce a positive printing stencil corresponding to the original.

Another sample of the same material was processed to give a negative printing plate. For this purpose, the sample was exposed under a negative original, then was heated for 2 minutes at 140° C. and exposed again without an original for the same period of time as used in the imagewise exposure. Upon developing in the same developer and for the same period of time as used above, a reversed image of the original was obtained.

What is claimed is:

1. A process for producing negative relief copies, comprising the steps of:
   (a) imagewise exposing a light-sensitive material to light through an original, said material comprising a light-sensitive layer which consists essentially of (1) a binder that is insoluble in water and soluble in aqueous-alkaline solutions and (2) an amount of a 1,2-quinone diazide sufficient to render said layer light-sensitive, said diazide comprising at least one of an ester and an amide of one selected from the group consisting of a 1,2-benzoquinone-2-diazide-4-sulfonic acid, a 1,2-benzoquinone-2-diazide-4-carboxylic acid, a 1,2-naphthoquinone-2-diazide-4-sulfonic acid, and a 1,2-naphthoquinone-2-diazide-4-diazide-4-carboxylic acid, such that said diazide undergoes photodecomposition; thereafter
   (b) heating said material, such that cross-linking is effected in portions of said light-sensitive layer exposed to said light;
   (c) after (b), cooling and then exposing said material again without said original, such that portions of said light-sensitive layer not exposed during step (a) are rendered alkali-soluble; and then
   (d) developing said material with an aqueous-alkaline developer, such that said portions of said layer rendered alkali-soluble are solubilized.

2. A process as claimed in claim 1, wherein said 1,2-quinone diazide comprises a reaction product of (a) one selected from the group consisting of 1,2-benzoquinonediazide-4-sulfonic acid, 1,2-benzoquinonediazide-4-sulfonic acid chloride, 1,2-naphthoquiononediazide-4-sulfonic acid, and 1,2-naphthoquinonediazide-4-sulfonic acid chloride and (b) a phenol-aldehyde/acetone condensation product or one selected from the group consisting of a polymer of p-hydroxystyrene, a polymer of p-aminostyrene, and a copolymer of p-hydroxystyrene and p-aminostyrene.

3. A process as claimed in claim 1, wherein step (b) comprises heating said material to a temperture in the range from about 80° to about 160° C.

4. A process as claimed in claim 1 wherein step (b) comprises heating said material for a period of time ranging from about 30 seconds to about 30 minutes.

5. A process as claimed in claim 1, wherein said binder comprises a novolak.

6. A process as claimed in claim 1, wherein said light-sensitive layer comprises from about 3 to 50% by weight of 1,2-quinonediazide, based on novolatile constituents of said light-sensitive layer.

7. A process as claimed in claim 1, wherein said binder comprises at least one from the group consisting of a polyhydroxyphenyl resin, a copolymer of styrene and maleic anhydride, a polyvinylphenol, and a copolymer of acrylic acid or methacrylic acid.

8. A process as claimed in claim 1, wherein said binder comprises alkali-soluble resin in an amount ranging between about 30 and 90% by weight, based on total solids in said binder.

9. A process as claimed in claim 8, wherein said binder comprises alkali-soluble resin in an amount ranging between about 50 and about 90% by weight, based on total solids in said binder.

10. A process for producing negative relief copies, comprising the steps of:
    (a) imagewise exposing a light-sensitive material to light through an original, said material comprising a light-sensitive layer which consists of (1) a binder that is insoluble in water and soluble in aqueous-alkaline solutions and (2) an amount of a 1,2-quinone diazide sufficient to render said layer light-sensitive, said diazide comprising at least one of an ester and an amide of one selected from the group consisting of a 1,2-benzoquinone-2-diazide-4-sulfonic acid, a 1,2-benzoquinone-2-diazide-4-carboxylic acid, a 1,2-naphthoquinone-2-diazide-4-sulfonic acid, and a 1,2-naphthoquinone-2-diazide-4-diazide-4-carboxylic acid, such that said diazide undergoes photodecomposition; thereafter
    (b) heating said material, such that cross-linking is effected in portions of said light-sensitive layer exposed to said light;
    (c) after (b), cooling and then exposing said material again without said original, such that portions of said light-sensitive layer not exposed during step (a) are rendered alkali-soluble; and then
    (d) developing said material with an aqueous-alkaline developer, such that said portions of said layer rendered alkali-soluble are solubilized.

11. A process as claimed in claim 10, wherein said 1,2-quinone diazide comprises a reaction product of (a) one selected from the group consisting of 1,2-benzoquinonediazide-4-sulfonic acid, 1,2-benzoquinonediazide-4-sulfonic acid chloride, 1,2-naphthoquinonediazide-4-sulfonic acid, and 1,2-naphthoquinonediazide-4-sulfonic acid chloride and (b) a phenol-aldehyde/acetone condensation product or one selected from the group consisting of a polymer of p-hydroxystyrene, a polymer of p-aminostyrene, and a copolymer of p-hydroxystyrene and p-aminostyrene.

* * * * *

UNITED STATES PATENT AND TRADEMARK OFFICE
CERTIFICATE OF CORRECTION

PATENT NO. : 4,576,901

DATED : March 18, 1986

INVENTOR(S) : Paul Stahlhofen & Gerhard Mack

It is certified that error appears in the above-identified patent and that said Letters Patent is hereby corrected as shown below:

Column 9, line 50, delete "4-diazide-".

Column 10, lines 44 & 45, delete "4-diazide-".

Signed and Sealed this

Eighteenth Day of November, 1986

*Attest:*

DONALD J. QUIGG

*Attesting Officer*  *Commissioner of Patents and Trademarks*